United States Patent
Berger et al.

(10) Patent No.: US 6,413,408 B1
(45) Date of Patent: ***Jul. 2, 2002

(54) METHOD FOR THE PRODUCTION OF A POROUS LAYER

(75) Inventors: Michael Berger, Wachtberg; Michael Krüger, Tübingen; Markus Thönissen, Nettetal; Rüdiger Arens-Fischer; Hans Lüth, both of Aachen; Walter Lang, VS-Villingen; Wolfgang Theiss, Aachen; Stefan Hilbrich, Herzogenrath, all of (DE)

(73) Assignee: Forschungszentrum Jülieh GmbH, Jülich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/336,546

(22) Filed: Jun. 19, 1999

Related U.S. Application Data

(63) Continuation-in-part of application No. PCT/DE97/03006, filed on Dec. 20, 1997.

(30) Foreign Application Priority Data

Dec. 20, 1996 (DE) .......................................... 196 53 097

(51) Int. Cl.$^7$ ............................ B23H 3/00; B23H 5/00; C25F 3/00; C25F 7/00; H05K 3/07

(52) U.S. Cl. ........................................ 205/655; 205/656
(58) Field of Search ................................ 205/667, 640, 205/641, 645, 655, 656

(56) References Cited

U.S. PATENT DOCUMENTS

| | | | | |
|---|---|---|---|---|
| 4,283,259 A | * | 8/1981 | Melcher et al. | 205/646 |
| 4,303,482 A | * | 12/1981 | Buhne et al. | 205/646 |
| 4,622,114 A | * | 11/1986 | Glass et al. | 205/655 |
| 5,218,472 A | | 6/1993 | Josefowicz et al. | |
| 5,338,415 A | * | 8/1994 | Sailor et al. | 205/645 |
| 5,696,629 A | | 12/1997 | Berger et al. | |

FOREIGN PATENT DOCUMENTS

| | | |
|---|---|---|
| DE | 43 19 413 | 12/1994 |
| DE | 44 10 657 | 10/1995 |
| DE | 195 22 737 | 1/1997 |
| GB | 1 106 062 | 3/1968 |

* cited by examiner

*Primary Examiner*—Bruce F. Bell
*Assistant Examiner*—Wesley A. Nicolas
(74) *Attorney, Agent, or Firm*—Klaus J. Bach

(57) ABSTRACT

An interference filter having a layer with an area consisting of a porous material extending from the surface of the layer to the interior, the dimensions of the porous layer area in a direction normal to the layer surface have different values to provide for varying reflection or, respectively, transmission characteristics.

6 Claims, 2 Drawing Sheets

METHOD FOR THE PRODUCTION OF A POROUS LAYER

This is a continuation-in-part application of international application PCT/DE97/03006 filed Dec. 20, 1997 and claiming the priority of German application 196 53 097.0 filed Dec. 20, 1996.

BACKGROUND OF THE INVENTION

The invention relates to a layer with a porous area for use, for example, in an interference filter. The invention further relates to a process of manufacturing such a layer.

Porous silicon (PS) is known which, because of its compatibility with the highly developed Si-microelectronics and because it is easy and inexpensive to manufacture, is a promising material for use as sensors (M. Thust et al., Meas. Sci. Technol. 6, (1995), as well as Y. Duvault-Herrera et al., colloid. Surf., 50,197, (1990) and, because of its electroluminescence, is suitable for applications in the area of display technology (P. Steiner et al., Appl. Phys. Lett., 62(21), 2700, (1993). Furthermore, porous silicon is known to be used in connection with color-sensitive photo detectors (M. Krüger et al., EMRS 96, Thin Solid films) or passive reflection filters.

The manufacture of layer systems of PS has been demonstrated (M. G. Berger et al., J. Phys. D: Appl. Phys. 27, 1333, (1994), DE P 43 19 413.3 or M. G. Berger et al., Thin Solid Films, 255, 313, (1995)). These layer systems exhibit for example, a color-selective reflectivity depending on the manufacturing parameters. Furthermore, the structured manufacturing of PS is known, whereby areas with different spectral behavior an be made (M. Krüger et al., EMRS 95, Thin Solid films).

Specifically, porous silicon consists of a foam-like skeleton of silicon crystallites, which include pores. The size of the crystallites and of the pores varies, depending on the doping and the manufacturing parameters, between some nanometers and some micrometers. If the wave length of the light is much greater than the structures in the PS, the PS appears to the light to be a homogeneous material ("effective medium") and its properties can therefore be described by an effective refraction index (W. Theiss: The Use of Effective Medium Theories in Optical Spectroscopy, in Festk örperprobleme/Advances in Solid State Physics, Volume 33, page 149, Vieweg, Braunschweig/Wiesbaden), which depends on the refraction indices of the silicon crystallite, an oxide possibly present on the surface of the crystallite and of the material in the pores. Consequently, interference filters can be constructed from various porous layers, which extend parallel to one another and have different optical properties. The various layers are constructed parallel to one another and have, within the respective layer, a constant layer thickness normal to the layer surface. It is however disadvantageous that for each of the different spectral characteristics, a separate filter must be made in separate manufacturing steps.

It is also disadvantageous that, in the known methods, the manufacture of adjacent filters with different characteristcs can be achieved only by photolithographic steps, or respectively, by separate etching of the filters with particular characteristics.

It is therefore the object of the invention ti provide a layer including a porous layer and an interference filter including such a layer as well as a process of manufacturing such an interference filter wherein a simplified establishment of interference filter functions of porous silicon with laterally gradually variable reflection and transmission characteristics is achieved.

SUMMARY OF THE INVENTION

In an interference filter having a layer with an area consisting of a porous material extending from the surface of the layer to the interior, the dimensions of the porous layer area in a direction normal to the layer surface have different values to provide for varying reflection or, respectively, transmission characteristics.

It has been found that, based on the well known manufacture of layer systems of porous silicon, a method could be provided wherein a lateral change of the reflection and transmission capabilities is achieved.

In particular, a layer system with a well-defined laterally variable spectral characteristic is manufactured thereby in a single process step. In this process, a porous layer area is so formed that the porous layer thickness assumes different values within this layer. In this way with such a porous area adjustable characteristics within this single layer can be achieved depending on desired boundary conditions. It is no longer necessary to manufacture several components individually which have different characteristics and which are then combined.

Furthermore, it may be advantageous to provide within the porous area several different porosity values in order to provide for individually desired characteristics in a controllable manner. Also, the degree of porosity may be established laterally for example in a continuous way. The area furthermore may have several partial layer areas with different degrees of porosity.

For a simplified manufacture, it may be advantageous to form the porous layer and/or the partial layer areas such that they are wedge-shaped. Preferably Al, GaAs, or SiGe are suitable materials, but most advantageous is the silicon which is used in many ways in microelectronics.

It has been realized that it is advantageous to establish during the manufacture of such a layer, upon etching for making the material porous, a gradient with respect to a physical value which corresponds to the etching velocity of such an etching procedure. Alternatively, or additionally, a value can be selected which corresponds to the porosity of the material. As physical value, preferably the electric field is employed and, the temperature is used. The material of the substrate or the doping of the material may be employed. The values may be employed individually or in combination together.

It is advantageous to utilize the electrodes provided for the electrochemical etching for the formation of the field gradient. In this case, a first electrode may be arranged in the electrolyte disposed above the surface to be etched, whereas a second electrode is disposed on the side of the substrate remote from this surface. Furthermore, such an electrode may be arranged in a tilted fashion so as to form a field gradient. Furthermore, the electrode or electrodes may be in the form of a net and may include a mesh structure to form gradients wherein the mesh openings are increasingly narrower in the direction of the gradient.

The layer system according to the invention can be made for example by current flow with a lateral gradual change of the reflection or respectively, transmission characteristic utilizing the temperature dependency of the etching process. As a result of the temperature dependency, the etching rate or, respectively, the porosity changes when the temperature of the electrolyte/substrate changes. Consequently, temperature gradients in the electrolyte or in the substrate can change locally the etching rate and, as a result, also the optical properties of a filter.

Alternatively, the layer system according the invention can be made with a laterally gradual change of the reflection and or, respectively, transmission characteristics utilizing a changed anode or, respectively, cathode arrangement. As a result of the dependency of the etching process on the field strength between the anode and the cathode, the etching rate or, respectively, porosity is changed between the electrodes. Consequently, field strength gradients may change the etching rate between the electrodes and consequently also the optical properties of a filter.

The invention however is not limited to such processes. In accordance with the invention, alternative processes are possible wherein another value, which affects the etching process, is used to achieve a gradual change of the porosity. For example, the doping of the substrate material before the etching may be so selected that there is a lateral gradient in the substrate.

The invention is explained below in greater detail on the basis of figures and embodiments.

DESCRIPTION OF A PREFERRED EMBODIMENT

Figure 1:
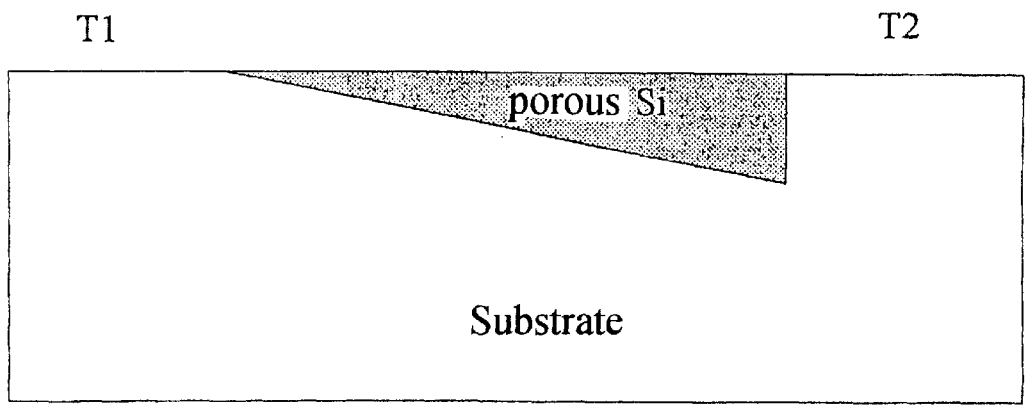
FIG. 1: A layer arrangement according to the invention.

FIG. 1 shows, in a cross-sectional view, an interference filter formed on a wafer on which porous silicon was etched. Because of the different temperatures $T_1$ and $T_2$ and the changing etching rates resulting therefrom a wedge-shaped structure is formed.

Figure 2:
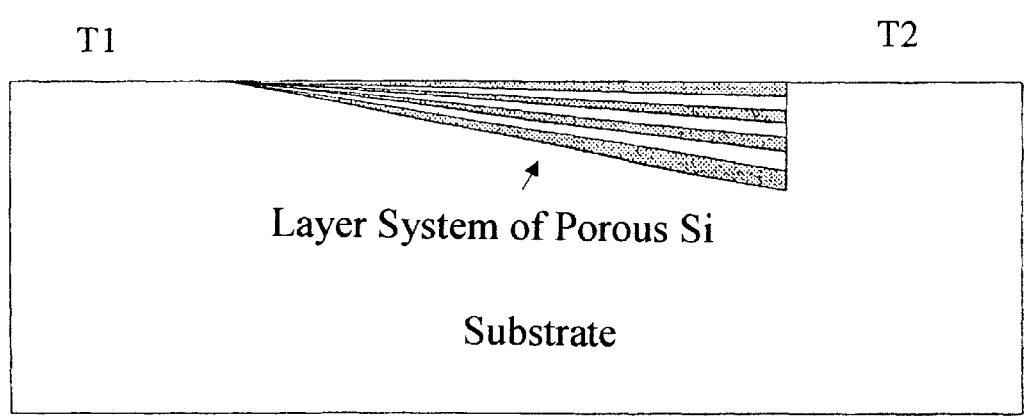
FIG. 2: A layer arrangement according to the invention.

FIG. 2 also shows, in a cross-sectional view, a filter according to the invention which however consists of a layer system with differently porous areas. Because of the different thicknesses of the individual layers, a laterally gradual change of the interference characteristics is achieved.

Figure 3:
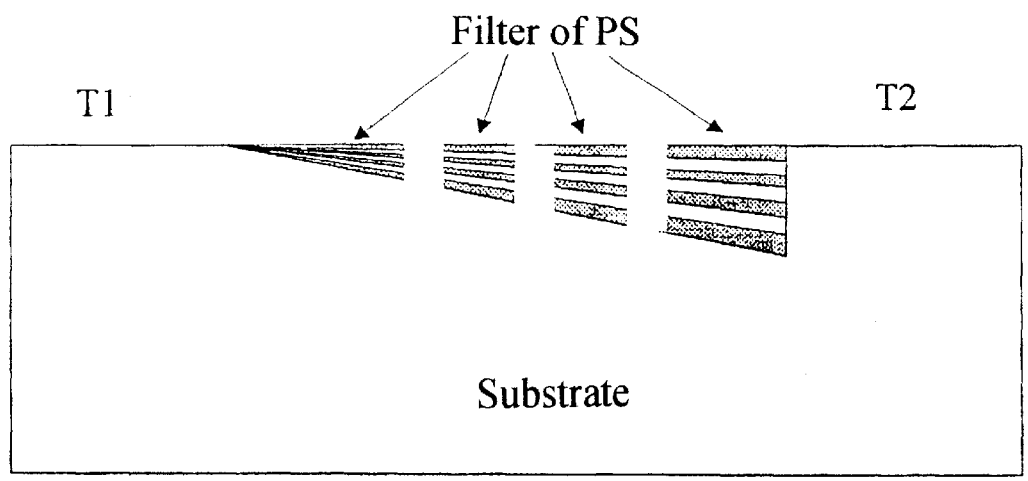
FIG. 3: A layer arrangement according to the invention.

Finally, FIG. 3 shows, similar to the previous figures, a laterally gradual layer system with individual pixels made in a single manufacturing step.

Particularly, with regard to the invention as described, the following comments are made:

Within the frame of the object of the invention to make laterally inhomogeneous layers or filters, particularly with laterally varying reflection characteristics, it has been found that the desired arrangement or formation or, respectively, the change of the rear contact, influences advantageously the structure of the subject of the invention, particularly of the filter.

Figure 4:
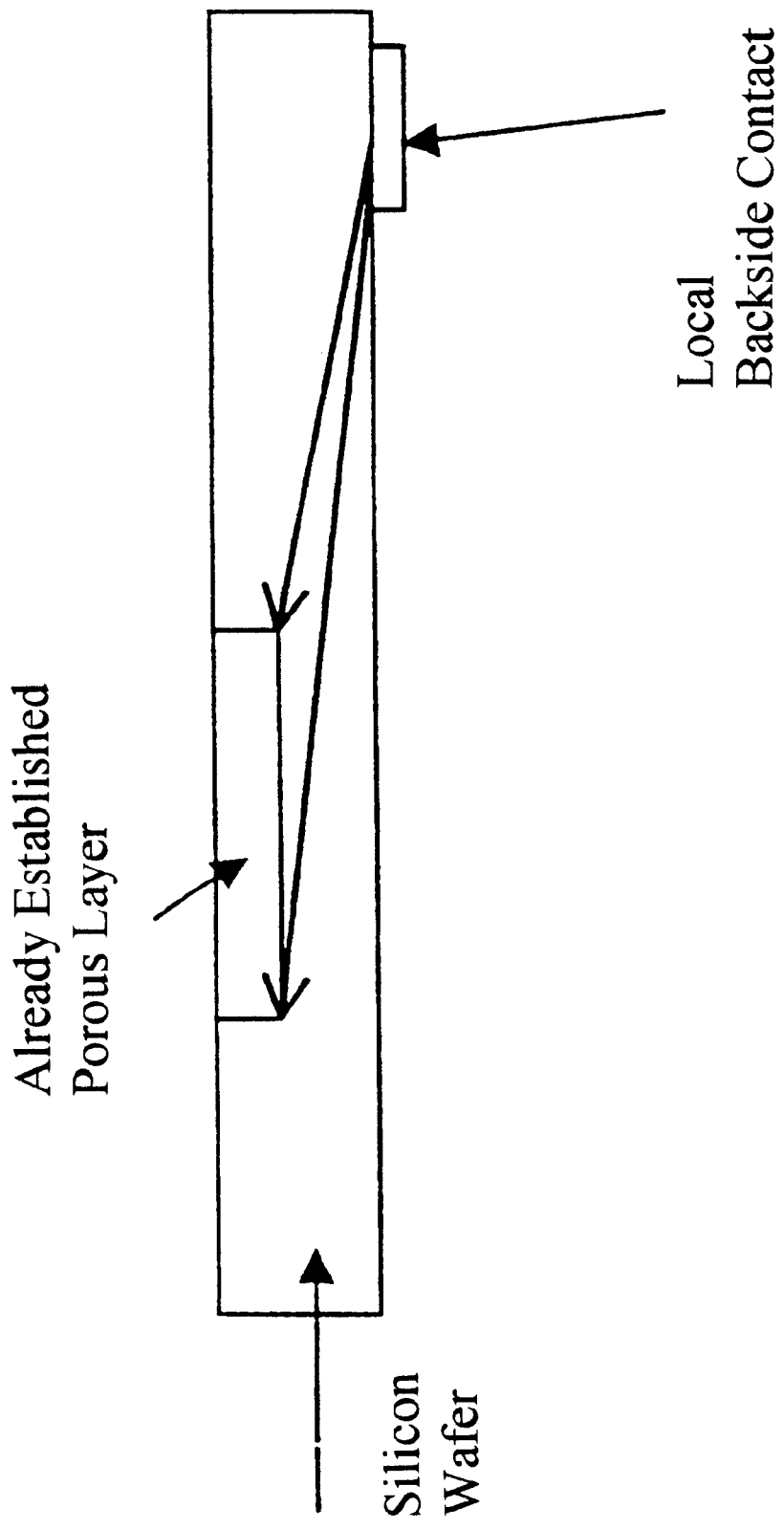
FIG. 4: A structure according to the invention.

In the structure according to the invention as shown in FIG. 4, the current flow from the local back-slide contact to the porous layer differs since the charge carriers have paths of different length from the contact point to the porous layer. This behavior depends, on one hand, on the size of the porous structure and, on the other hand, on the distance of the backside contact from the porous layer, and consequently, finally on the substrate resistance. In this manner, the etching rate is different at various points of the structure, which results in the formation of interference filters with laterally gradually variable characteristics.

In this way, particularly with respect to the change of the electrical field, a wide application may reside in suitably forming the geometric pattern of the reflection characteristics of the structure according to the invention in a lateral direction. For example, as the contact geometry of the rear contact a plurality of individual local contacts may be provided at different locations on the backside. Furthermore, these local contacts may be formed while being subjected to different currents.

What is claimed is:

1. A process of manufacturing a substrate with a porous layer area by electrochemical etching, comprising the steps of: establishing in said substrate a temperature such that one of a substrate and an electrolyte provided for the etching are subjected over said layer area to a temperature gradient, which is controlled from the outside, and electrochemically etching said substrate thereby providing in said substrate a porous layer area of a thickness corresponding to the temperature gradient established in said area of said substrate.

2. A process according to claim 1, wherein, for providing said gradient on said substrate, the substrate is heated by an electric current at locally different rates.

3. A process according to claim 1, wherein said area of said substrate is heated by one of laser and microwave heating.

4. A process of manufacturing a substrate with a porous layer area by electrochemical etching, comprising the steps of: establishing in said layer area an electrical field affecting one of an electrochemical etching speed and the porosity of said layer area, providing in said layer area a gradient of said electrical field and electrochemically etching said substrate thereby providing in said substrate a porous layer area of a thickness corresponding to the gradient of the electrical field established in said layer area.

5. A process according to claim 4, wherein, for the establishment of the field strength gradient over said layer area, an electrode disposed opposite the substracte surface area is arranged in a tilted manner.

6. A process according to claim 4, wherein, for the establishment of the field strength gradient over said layer area, a net-like electrode having meshes is selected and the meshes contained in said net-like electrode become narrower in the direction in which the gradient is to be established.

* * * * *